United States Patent
Lai et al.

(10) Patent No.: US 7,067,375 B1
(45) Date of Patent: Jun. 27, 2006

(54) NON-VOLATILE MEMORY AND METHOD FOR FABRICATING THE SAME

(75) Inventors: Erh-Kun Lai, Hsinchu (TW); Hang-Ting Lue, Hsinchu (TW); Yen-Hao Shih, Hsinchu (TW); Chia-Hua Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/018,507

(22) Filed: Dec. 20, 2004

(51) Int. Cl.
*H01L 21/8238* (2006.01)
*H01L 21/336* (2006.01)
*H01L 21/3205* (2006.01)
*H01L 21/4763* (2006.01)

(52) U.S. Cl. ..................... 438/261; 438/216; 438/591; 438/593

(58) Field of Classification Search ........ 438/257–265, 438/216, 591–593
See application file for complete search history.

(56) References Cited

U.S. PATENT DOCUMENTS

| 6,825,523 B1 * | 11/2004 | Caprara et al. | 438/261 |
| 6,858,497 B1 * | 2/2005 | Moriya et al. | 438/261 |
| 6,878,988 B1 * | 4/2005 | Lee et al. | 438/591 |

* cited by examiner

*Primary Examiner*—Cuong Nguyen
(74) *Attorney, Agent, or Firm*—J.C. Patents

(57) ABSTRACT

A non-volatile memory is provided. The memory comprises a substrate, a dielectric layer, a conductive layer, an isolation layer, a buried bit line, a tunneling dielectric layer, a charge trapping layer, a barrier dielectric layer and a word line. Wherein, the dielectric layer is disposed on the substrate. The conductive layer is disposed on the dielectric layer. The isolation layer is disposed on the substrate and adjacent to the dielectric layer and the conductive layer. The buried bit line is disposed in the substrate and underneath the isolation layer. The tunneling dielectric layer is disposed on both the substrate and the sidewalls of the conductive layer and the isolation layer. The charge trapping layer is disposed on the tunneling dielectric layer and the barrier dielectric layer is disposed on the charge trapping layer. The word line is disposed on the substrate, crisscrossing with the buried bit line.

17 Claims, 5 Drawing Sheets

NON-VOLATILE MEMORY AND METHOD FOR FABRICATING THE SAME

BACKGROUND OF THE INVENTION

1. Field of the Invention

The present invention relates to a memory, and more particularly, to a non-volatile memory and a method for fabricating the same.

2. Description of the Related Art

The non-volatile memory is characterized by maintaining the stored data even when the power is down, and has thus become a mandatory device in many electronic products for providing normal operation of the electronic products when booted. Thus, the non-volatile memory has been widely used device in personal computer (PC) and other electronic equipment.

In a conventional non-volatile memory, a stacked layer made of oxide-nitride-oxide (ONO layer) is disposed between a gate and a substrate. Wherein, the nitride layer, used as a film layer where the charges are trapped in, is also known as a charge trapping layer, and the memory cell, whose charge trapping layer is made of such material, is called Nitride Read Only Memory.

FIG. 1 schematically shows a cross-sectional view of a conventional nitride read only memory. Referring to FIG. 1, the nitride read only memory comprises a substrate 100, a source 102, a drain 104, a bottom silicon oxide layer 106, a nitride layer 108, a top silicon oxide layer 110, and a gate 112. Wherein, the bottom silicon oxide layer 106, the nitride layer 108, and the top silicon oxide layer 110, which are all disposed on the substrate 100, form an oxide-nitride-oxide stacked layer, the so-called ONO layer 114. In addition, the larger dotted circle shown in the diagram indicates a memory cell 116, and the smaller dotted circles indicate a first bit 118 and a second bit 120, respectively. Regarding to the memory cell 116, a memory cell can basically store one bit (first bit 118 and second bit 120) at the two side of the nitride layer 108 of the ONO layer 114 near the drain 104 and the source 102, respectively, thereby forming a single memory cell 2 bits/cell non-volatile memory.

However, when programming a conventional 2 bits non-volatile memory, two bits in the same memory cell are conditioned by each other, which may cause problems. In other words, if a bit (the second bit 120) has been stored in a portion near the drain 104, a $2^{nd}$-bit effect occurs when the process of reverse read is performed, such that the voltage in the portion where a high current is expected may drop. That is, when the memory cell is being read, the existing bit may have direct impact on the memory cell, thus increasing the barrier and the threshold voltage (Vt) for reading. In addition, the cross interference of two bits in the single memory cell mentioned above may substantially implicate the device operation and even deteriorate the device reliability.

Moreover, when programming the conventional 2 bits non-volatile memory, the hot electrons injected into the electron trapping layer may form an electron distribution curve according to the injected energy. However, the $2^{nd}$-bit effect mentioned above cause the charge distribution curve to be wider and the curves to overlap. Therefore, when erasing the memory cell, the distribution curve formed when injecting the hot electrons into the charge trapping layer can not match with the electron distribution curve, thus the erasing will take more time and worse, the whole content of the memory cell may not be totally erased.

SUMMARY OF THE INVENTION

Accordingly, an object of the present invention is to provide a method for fabricating a non-volatile memory capable of preventing cross interference of two bits in the single memory cell of the non-volatile memory, such that the reliability of the memory device is enhanced.

Another object of the present invention is to provide a non-volatile memory capable of saving two bits data in a single memory cell, without the $2^{nd}$-bit effect and other problems derived from it.

The present invention provides a method for fabricating a non-volatile memory. In the method, a substrate is provided, and a dielectric layer, a conductive layer, and a mask layer are sequentially formed on the substrate. Then, a plurality of first openings, which exposes the substrate, are formed by patterning the mask layer, the conductive layer, and the dielectric layer. Then, a buried bit line is formed in the substrate at the bottom of the first opening, and an isolation layer is formed in the first openings on the substrate. Afterwards, part of the isolation layer is removed, and the remained isolation layers are served as a mask for forming a plurality of second openings. Then, the mask layer and the isolation layer covered on the mask layer are removed, and a tunneling dielectric layer, a charge trapping layer, and a barrier dielectric layer are sequentially formed on the substrate, so as to jointly cover the second openings, the isolation layer and the conductive layer, and a material layer further fills the second openings. Thereafter, parts of the tunneling dielectric layer, the charge trapping layer, and the barrier dielectric layer not covered by the material layer are removed. Finally, the material layer is removed, and a word line is formed on the substrate.

According to the method for fabricating the non-volatile memory in the present invention, the method for forming the isolation layer mentioned above comprises a HDP-CVD (high density plasma chemical vapor deposition) process.

According to the method for fabricating the non-volatile memory in the present invention, the isolation layer mentioned above can be made of silicon oxide, nitride, or SiOxNy.

According to the method for fabricating the non-volatile memory in the present invention, after a part of the isolation layer is removed, a plurality of angled isolation layers are formed on the mask layers and the bottom width of the angled isolation layer is less than the width of the mask layer located below it.

According to the method for fabricating the non-volatile memory in the present invention, the method for forming the second openings comprises an etching process.

According to the method for fabricating the non-volatile memory in the present invention, the mask layer mentioned above can be made of nitride.

According to the method for fabricating the non-volatile memory in the present invention, the dielectric layer mentioned above can be made of silicon oxide. According to the method for fabricating the non-volatile memory in the the present invention, the method for forming the conductive layer and the mask layer mentioned above comprises a chemical vapor deposition (CVD) process.

According to the method for fabricating the non-volatile memory in the present invention, the method for forming a buried bit line in the substrate at the bottom of the first openings comprises an ion implanting process.

According to the method for fabricating the non-volatile memory in the present invention, the method for removing the mask layer and the isolation layers covered on the mask layer comprises an etching process or a lift off process.

According to the method for fabricating the non-volatile memory in the present invention, the method for filling the material layer into the second openings comprises a spin-on coating process.

According to the method for fabricating the non-volatile memory in the present invention, the material layer mentioned above can be made of a polymer material or a photoresistive material.

According to the method for fabricating the non-volatile memory in the present invention, the method for removing parts of the tunneling dielectric layer, the charge trapping layer, and the barrier dielectric layer not covered by the material layer comprises an etching process.

According to the method for fabricating the non-volatile memory in the present invention, the method for removing the material layer comprises an etching process.

According to the method for fabricating the non-volatile memory in the present invention, the word line mentioned above comprises a mixed polysilicon layer.

According to the method for fabricating the non-volatile memory in the present invention, the method for forming a word line on the substrate comprises a CVD process.

The present invention further provides a non-volatile memory. The memory comprises a substrate, a dielectric layer, a conductive layer, an isolation layer, a buried bit line, a tunneling dielectric layer, a charge trapping layer, a barrier dielectric layer and a word line. Wherein, the dielectric layer is disposed on the substrate. The conductive layer is disposed on the dielectric layer. In addition, the isolation layer is disposed on the substrate and adjacent to the dielectric layer and the conductive layer. The buried bit line is disposed in the substrate and underneath the isolation layer. Wherein, the tunneling dielectric layer is disposed on both the substrate and the sidewalls of the conductive layer and the isolation layer. The charge trapping layer is disposed on the tunneling dielectric layer and the barrier dielectric layer is disposed on the charge trapping layer. Further, the word line is disposed on the substrate, crisscrossing with the buried bit line.

It is known from the above that, in the present invention, a dielectric layer is formed on the substrate first to separate the charge trapping layer. That is, each bit on the memory cell is isolated so as to avoid the cross interference of two bits in the single memory cell, or the so-called $2^{nd}$-bit effect. In addition, in the present invention, the abnormal voltage or abnormal current during writing and erasing the memory cell is unlikely to occur. Such problem may cause the device to malfunction and further deteriorate the device reliability.

Additionally, the bottom width of the angled isolation layer formed according to the present invention is less than the bottom width of the film layer below it, and the angled isolation layer can be used as an etch mask for removing the unnecessary film layers during the process, which is called a self-aligned process. Therefore, the self-aligned process mentioned above can produce an accurate pattern without forming a mask layer to cover the to-be-removed film layer or other process.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE EMBODIMENTS

FIGS. 2A~2I schematically show cross-sectional views of a flow chart illustrating a method for fabricating a non-volatile memory according to an embodiment of the present invention.

Figure 1:
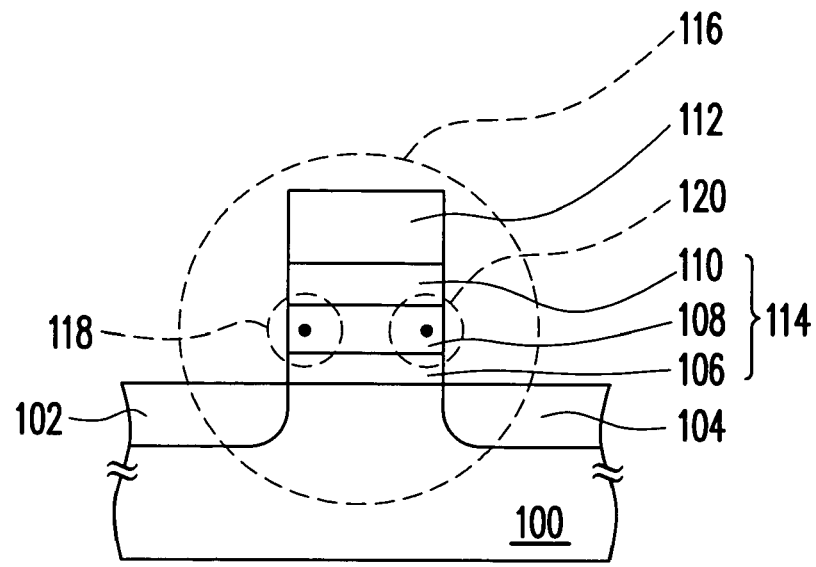
FIG. 1 schematically shows a cross-sectional view of a conventional non-volatile memory.
Figure 2A:
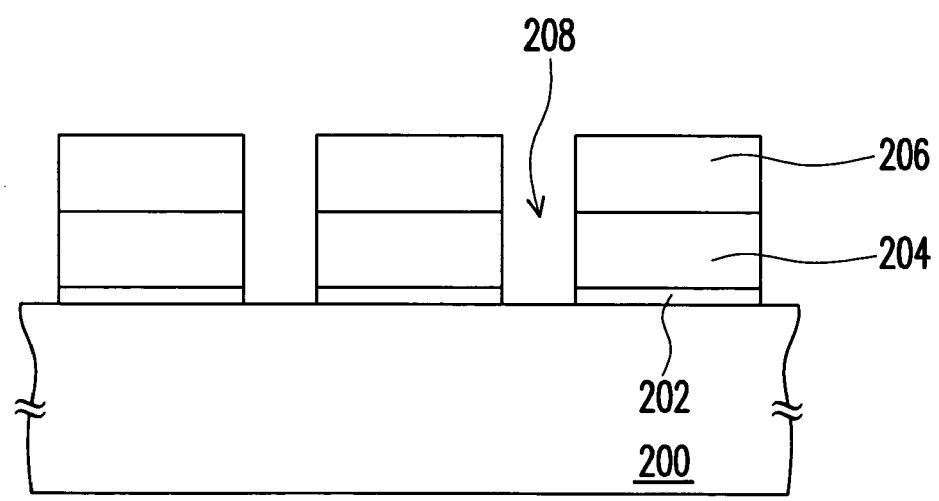
FIGS. 2A~2I schematically show cross-sectional views of a flow chart illustrating a method for fabricating a non-volatile memory according to an embodiment of the present invention.

Referring to FIG. 2A, a substrate 200 is provided, which is, for example, a silicon substrate. Then, a dielectric layer 202 is formed on the substrate 200, wherein the dielectric layer 202 can be made of silicon oxide using a thermal oxidation process, and the dielectric layer 202 is used as a gate oxide layer.

Then, a conductive layer 204 is formed on the dielectric layer 202, and a mask layer 206 is formed on the conductive layer 204. Wherein, the mask layer 206 can be made of nitride using, for example, a chemical vapor deposition (CVD) process.

Then, a plurality of openings 208, which expose the substrate 200, are formed by pattering the mask layer 206, the conductive layer 204, and the dielectric layer 202. Wherein, the method for forming the openings 208 exposing the substrate 200 comprises covering the substrate 200 with a photoresistive layer (not shown), and then performing an exposing and developing process so as to form a patterned photoresistive layer. Afterwards, the patterned photoresistive layer is used as a mask for performing an etching process, so as to continuously remove the mask layer 206, the conductive layer 204, and the dielectric layer 202 until the substrate 200 is exposed by the formed openings 208. Thereafter, the patterned photoresistive layer is removed.

Figure 2B:
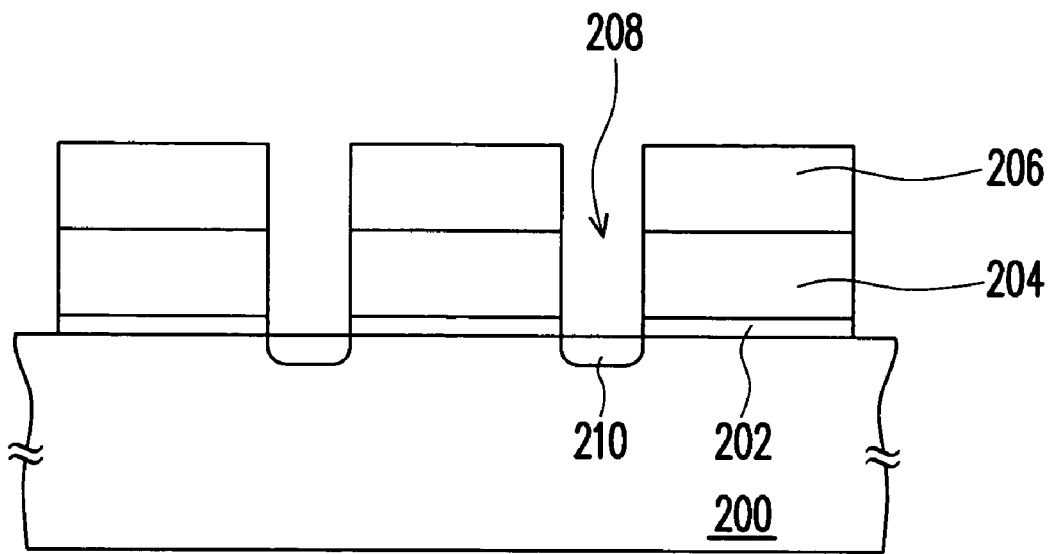

Referring to FIG. 2B, a buried bit line 210 is formed in the substrate 200 at the bottom of each opening 208. Wherein, the method for forming a buried bit line 210 in the substrate 200 at the bottom of each opening 208 comprises an ion implanting process.

Figure 2C:
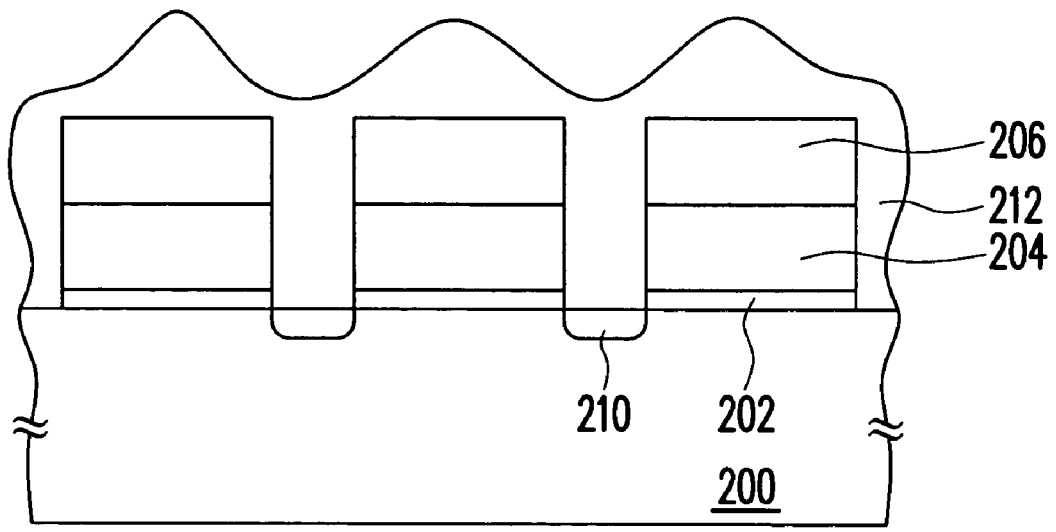

Referring to FIG. 2C, an isolation layer 212 is formed in the openings 208 on the substrate 200. Wherein, the isolation layer can be made of silicon oxide, nitride, or SiOxNy using a high density plasma chemical vapor deposition (HDP-CVD) process.

Figure 2D:
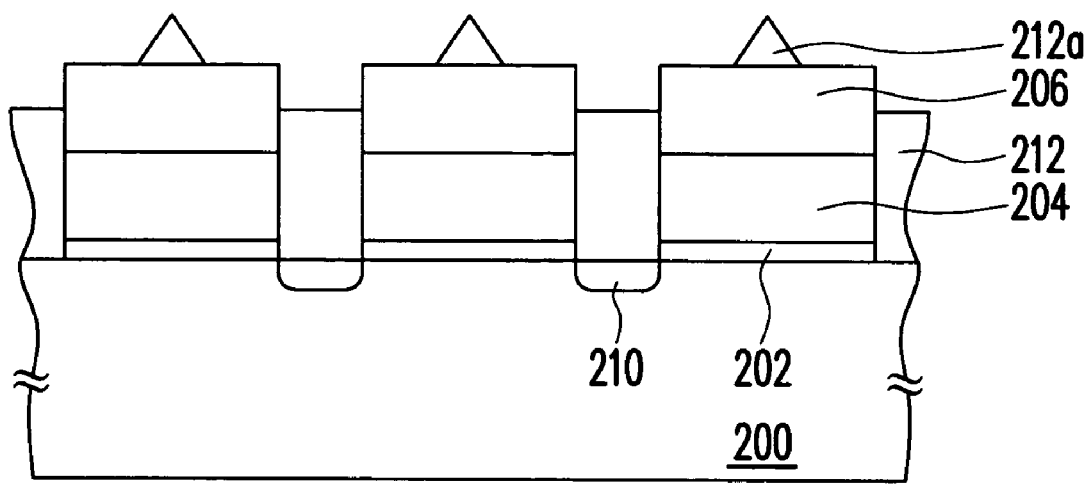

Referring to FIG. 2D, part of the isolation layer 212 is removed, and a plurality of angled isolation layers 212a are formed on the mask layer 206. Wherein, after part of the isolation layer 212 mentioned above is removed, the surface of the isolation layer 212 in the openings 208 is lower than the surface of the mask layer 206, and the top surface of the mask layer 206 is then exposed. In addition, the bottom width of the angled isolation layers 212a is less than the width of the mask layer 206 below it.

Figure 2E:
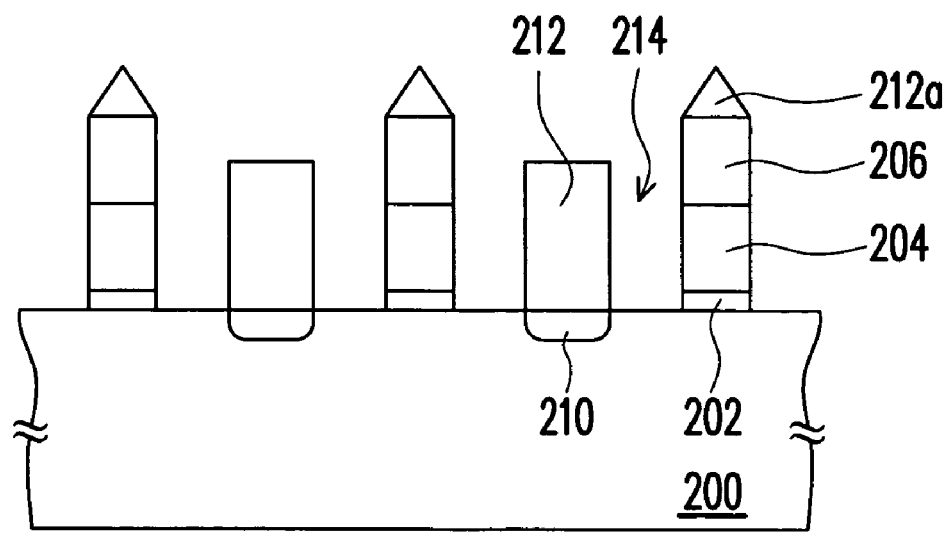

Referring to FIG. 2E, a plurality of openings 214 are formed by removing parts of the mask layer 206, the conductive layer 204 and the dielectric layer 202 underneath not covered by the angled isolation layers 212a. Wherein, the method for forming the openings 214 mentioned above comprises performing an etching process by using the angled isolation layers 212a as a mask to remove the mask layer 206, the conductive layer 204 and the dielectric layer 202 underneath not covered by the angled isolation layers 212a.

More specifically, in the present invention, the bottom width of the angled isolation layers 212a mentioned above is less than the width of the mask layer 206 disposed below it. Therefore, in the steps mentioned above, the angled isolation layers 212a can be used as an etch mask for removing parts of the dielectric layer, the conductive layer, and the mask layer not covered by the isolation layer 212 and the angled isolation layers 212a. Such method can be viewed as a self-aligned process, and an accurate pattern can be produced by this self-aligned process in the manufacturing process. Additionally, besides the present embodiment, the self-aligned process mentioned above can also applied in other suitable manufacturing process. For example, it can be used in fabricating PACAND.

Figure 2F:
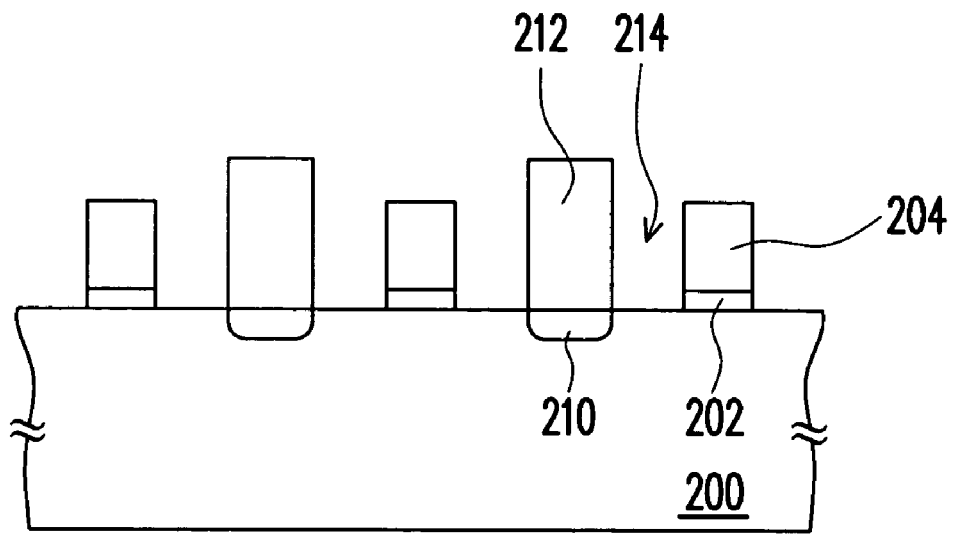

Referring to FIG. 2F, where the mask layer 206 and the angled isolation layers 212a are removed. Wherein, the method for removing the mask layer 206 and the angled isolation layers 212a comprises an etching process or a lift off process.

Figure 2G:
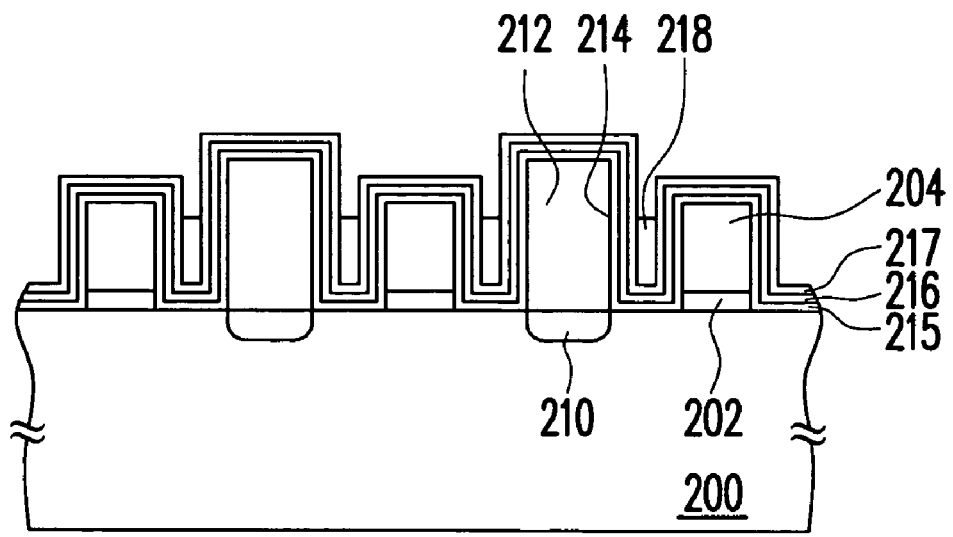

Referring to FIG. 2G, a tunneling dielectric layer 215, a charge trapping layer 216, and a barrier dielectric layer 217 are then sequentially formed on the substrate 200. Then, a material layer 218 is filled into the openings 214. Wherein, the tunneling dielectric layer 215 and the barrier dielectric layer 217 can be made of silicon oxide, and the charge trapping layer 216 can be made of nitride. Needless to say, the material of the charge trapping layer 216 is not limited to nitride, and any material that allows the charges to trap in is suitable in the present invention. In addition, the material layer 218 mentioned above can be made of a polymer material or a photoresistive material using a spin-on coating process.

Figure 2H:
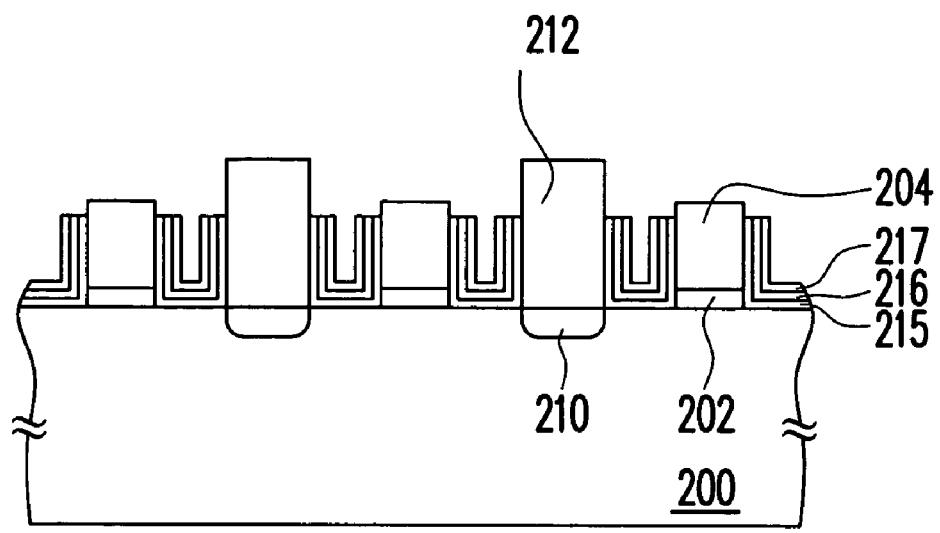

Referring to FIG. 2H, parts of the tunneling dielectric layer 215, the charge trapping layer 216, and the barrier dielectric layer 217 not covered by the material layer 218 are removed in an etching process. Then, the material layer 218 is removed. In addition, the material layer 218 can be made of a conductive material, and can be removed by etch back process.

Figure 2I:
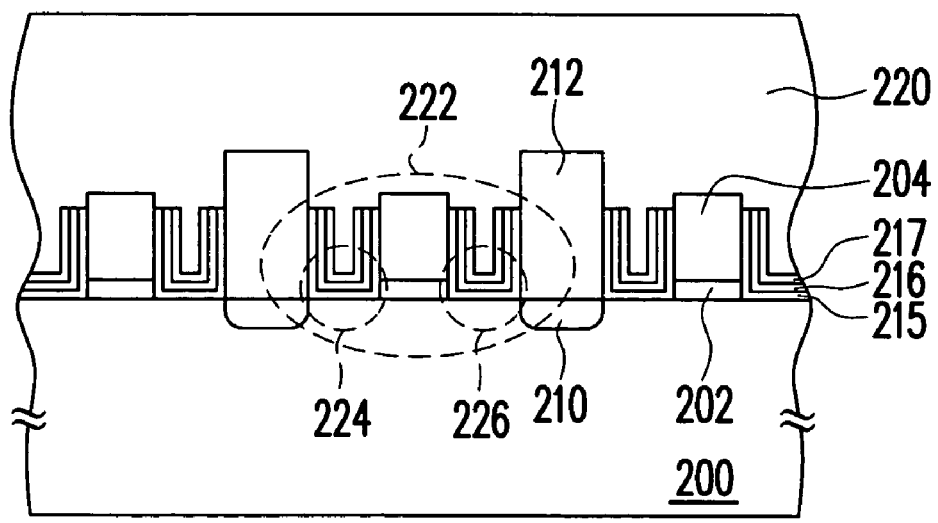

Referring to FIG. 2I, a word line 220 is formed on the substrate 200. Wherein, the method for forming the word line 220 comprises forming a conductive layer (not shown) on the substrate first, and then defining the conductive layer, so as to form a patterned conductive layer on the substrate, and the pattered conductive layer is perpendicular to the buried bit line. Wherein, the conductive layer (word line 220) mentioned above can be made of mixed polysilicon using a chemical vapor deposition (CVD) process.

The structure of the non-volatile memory produced according to the method for fabricating the non-volatile memory mentioned above is described in detail hereinafter.

Referring to FIG. 2I, where the larger dotted circle indicates a memory cell 222 of the nitride read only memory in the present invention, and the smaller dotted circles indicate a first bit 224 and a second bit 226, respectively. The structure of the non-volatile memory mentioned above comprises a substrate 200, a dielectric layer 202, a conductive layer 204, an isolation layer 212, a buried bit line 210, a tunneling dielectric layer 215, a charge trapping layer 216, a burrier dielectric layer 217, and a word line 220.

Wherein, the dielectric layer 202 is disposed on the substrate 200, and the conductive layer 204 is disposed on the dielectric layer 202. In addition, the isolation layer 212 is disposed on the substrate 200 and adjacent to the dielectric layer 202 and the conductive layer 204. The buried bit line 210 is disposed in the substrate 200 and underneath the isolation layer 212. The tunneling dielectric layer 215 is disposed on both the substrate 200 and the sidewalls of the conductive layer 204 and the isolation layer 212. The charge trapping layer 216 is disposed on the tunneling dielectric layer 215 and the barrier dielectric layer 217 is disposed on the charge trapping layer 216. The word line 220 is disposed on the substrate 200, crisscrossing with the buried bit line 210.

It can be seen from the above that, in the present invention, a dielectric layer 202 is formed on the substrate 200 first. In other words, parts of the tunneling dielectric layer 215, the charge trapping layer 216, and the barrier dielectric layer 217 are replaced by the dielectric layer 202. Namely, in the present invention, the dielectric layer 202 is formed next to the tunneling dielectric layer 215, the charge trapping layer 216, and the barrier dielectric layer 217, so as to isolate the first bit 224 and the second bit 226 in the memory cell 222. Therefore, the present invention can prevent the $2^{nd}$-bit effect during the memory operation.

In addition, the present invention further avoids the abnormal voltage or abnormal current problem during writing and erasing the memory cell, such problem causes the device malfunction and further impacts the device reliability.

In summary, the present invention has at least the following advantages:

1. In the present invention, a dielectric layer is formed in the memory to isolate each bit in the memory cell, such that the $2^{nd}$-bit effect can be avoided. In addition, the dielectric layer is disposed above a part of the channel region located between two neighboring buried bit lines, and serves as a gate dielectric layer, thus the voltage/current for writing/erasing is reduced.

2. Besides the present embodiment, the self-aligned process of the present invention also can be applied in other suitable manufacturing process. For example, it can be further applied in fabricating PACAND.

3. In addition to avoiding the cross interference between two bits, the present invention can further prevent the $2^{nd}$-bit effect which causes abnormal voltage or abnormal current when writing and erasing the memory cell and degrades the device reliability.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for fabricating a non-volatile memory, the method comprising:
   providing a substrate, and sequentially forming a dielectric layer, a conductive layer, and a mask layer on the substrate;
   pattering the mask layer, the conductive layer, and the dielectric layer to form a plurality of first openings exposing the substrate;
   forming a buried bit line in the substrate at the bottom of each first opening;
   forming an isolation layer in the first openings on the substrate;
   removing part of the isolation layer, and forming a plurality of second openings by using the remained isolation layers as a mask;

removing the isolation layers covered on the mask layer and the mask layer;

forming a tunneling dielectric layer, a charge trapping layer, and a barrier dielectric layer sequentially on the substrate, so as to jointly cover the second openings, the isolation layer and the conductive layer;

filling a material layer into the second openings;

removing parts of the tunneling dielectric layer, the charge trapping layer, and the barrier dielectric layer not covered by the material layer;

removing the material layer; and forming a word line on the substrate.

2. The method for fabricating the non-volatile memory of claim 1, wherein the method for forming the isolation layer comprises a high density plasma chemical vapor deposition (HDP-CVD) process.

3. The method for fabricating the non-volatile memory of claim 1, wherein the isolation layer can be made of silicon oxide, nitride, or SiOxNy.

4. The method for fabricating the non-volatile memory of claim 1, wherein at the step of removing part of the isolation layer, further comprises remaining a plurality of angled isolation layers on the mask layer.

5. The method for fabricating the non-volatile memory of claim 4, wherein a bottom width of each of the angled isolation layers is less than a width of the mask layer located below it.

6. The method for fabricating the non-volatile memory of claim 1, wherein the method for forming the second openings comprises an etching process.

7. The method for fabricating the non-volatile memory of claim 1, wherein the mask layer can be made of nitride.

8. The method for fabricating the non-volatile memory of claim 1, wherein the dielectric layer can be made of silicon oxide.

9. The method for fabricating the non-volatile memory of claim 1, wherein the method for forming the conductive layer and the mask layer comprises a chemical vapor deposition (CVD) process.

10. The method for fabricating the non-volatile memory of claim 1, wherein the method for forming the buried bit line in the substrate at the bottom of each of the first openings comprises an ion implanting process.

11. The method for fabricating the non-volatile memory of claim 1, wherein the method for removing the mask layer and the isolation layers covered on the mask layer comprises an etching process or a lift off process.

12. The method for fabricating the non-volatile memory of claim 1, wherein the method for filling the material layer into the second openings comprises a spin-on coating process.

13. The method for fabricating the non-volatile memory of claim 1, wherein the material layer can be made of a polymer material or a photoresistive material.

14. The method for fabricating the non-volatile memory of claim 1, wherein the method for removing parts of the tunneling dielectric layer, the charge trapping layer, and the barrier dielectric layer not covered by the material layer comprises an etching process.

15. The method for fabricating the non-volatile memory of claim 1, wherein the method for removing the material layer comprises an etching process.

16. The method for fabricating the non-volatile memory of claim 1, wherein the word line comprises a mixed polysilicon layer.

17. The method for fabricating the non-volatile memory of claim 1, wherein the method for forming the word line on the substrate comprises a chemical vapor deposition (CVD) process.

* * * * *